(12) United States Patent
Son et al.

(10) Patent No.: US 10,481,314 B2
(45) Date of Patent: Nov. 19, 2019

(54) DISPLAY APPARATUS AND POLARIZER THEREOF

(71) Applicant: LG Display Co., Ltd., Seoul (KR)

(72) Inventors: HaeJoon Son, Gyeonggi-do (KR); JoungHo Ryu, Seoul (KR); SieHyug Choi, Gyeonggi-do (KR); Yeasle Lee, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/217,323

(22) Filed: Jul. 22, 2016

(65) Prior Publication Data

US 2017/0023718 A1 Jan. 26, 2017

(30) Foreign Application Priority Data

Jul. 22, 2015 (KR) .................. 10-2015-0103796

(51) Int. Cl.
| | | |
|---|---|---|
| *G02B 1/08* | (2006.01) | |
| *G02B 5/20* | (2006.01) | |
| *G02B 5/30* | (2006.01) | |
| *H01L 51/52* | (2006.01) | |

(52) U.S. Cl.
CPC ............ *G02B 5/3075* (2013.01); *G02B 1/08* (2013.01); *G02B 5/208* (2013.01); *G02B 5/3091* (2013.01); *H01L 51/5281* (2013.01)

(58) Field of Classification Search
CPC .... G02B 5/3075; G02B 5/208; G02B 5/3091; G02B 1/08; H01L 51/5281
USPC ........................................................ 359/361
See application file for complete search history.

(56) References Cited

U.S. PATENT DOCUMENTS

| 9,421,572 | B2 * | 8/2016 | Hatanaka | ............. G02B 5/3016 |
|---|---|---|---|---|
| 2006/0267491 | A1 * | 11/2006 | Koo | .................... H01L 27/3265 |
| | | | | 313/511 |
| 2007/0242184 | A1 * | 10/2007 | Ohta | .................. G02F 1/133606 |
| | | | | 349/64 |
| 2012/0021143 | A1 * | 1/2012 | Hiratsuka | ............. C09K 19/60 |
| | | | | 428/1.31 |

(Continued)

FOREIGN PATENT DOCUMENTS

| CN | 101156096 A1 | 4/2008 |
|---|---|---|
| CN | 103901521 A1 | 7/2014 |

(Continued)

OTHER PUBLICATIONS

Keizo Miyasaka. PVA-Iodine Complexes: Formation, Structure, and Properties. Advances in Polymer Science, vol. 108 © Spfinger-Vertag Berlin Heidelberg 1993.*

(Continued)

*Primary Examiner* — Collin X Beatty
(74) *Attorney, Agent, or Firm* — Morgan, Lewis & Bockius LLP

(57) ABSTRACT

A display apparatus includes a substrate; a light emitting element on the substrate that is configured to emit visible light; and a polarizer including a polarizing object on the substrate and a supporting film on at least one surface of the polarizing object. The polarizing object is configured to absorb ultraviolet light and visible light having wavelengths shorter than a blue light of the visible light emitted from the light emitting element and is configured to transmit the visible light emitted from the light emitting element.

14 Claims, 20 Drawing Sheets

(56) References Cited

U.S. PATENT DOCUMENTS

| | | | | |
|---|---|---|---|---|
| 2012/0170245 A1* | 7/2012 | Hwang | ............... | G02B 5/305 |
| | | | | 362/19 |
| 2014/0319490 A1* | 10/2014 | Kim | ............... | G02B 1/105 |
| | | | | 257/40 |
| 2015/0370094 A1* | 12/2015 | Hashimoto | ............ | G02B 5/208 |
| | | | | 351/159.62 |
| 2016/0093833 A1* | 3/2016 | No | ............... | H01L 51/5293 |
| | | | | 257/40 |
| 2016/0216424 A1* | 7/2016 | Seo | ............... | G02B 5/3016 |
| 2016/0291224 A1* | 10/2016 | Ahn | ............... | G02B 5/3083 |
| 2017/0322358 A1* | 11/2017 | Ueki | ............... | G02B 5/3025 |

FOREIGN PATENT DOCUMENTS

| | | |
|---|---|---|
| CN | 104122615 A | 10/2014 |
| CN | 104181626 A | 12/2014 |
| WO | 2014/133111 A1 | 9/2014 |

OTHER PUBLICATIONS

First Notification of Office Action issued in corresponding Chinese Patent Application No. 201610585255.8, dated Feb. 27, 2019.

\* cited by examiner

DISPLAY APPARATUS AND POLARIZER THEREOF

This application claims priority from Korean Patent Application No. 10-2015-0103796, filed on Jul. 22, 2015, which is hereby incorporated by reference for all purposes as if fully set forth herein.

BACKGROUND OF THE INVENTION

Field of the Invention

The present invention relates to a display apparatus and a polarizer thereof.

Description of the Related Art

In recent years, a display apparatus, such as an organic light emitting display apparatus, a liquid crystal display apparatus, a field emission display apparatus, a plasma display apparatus, etc., has attracted a lot of attention due to its high response speed, low power consumption, and excellent color reproduction rate. Such display apparatuses are used in various electronic products, such as TVs, a computer monitors, notebook computers, mobile phones, display units in refrigerators, personal digital assistants, and automated teller machines.

Such display apparatuses may include a polarizer for various purposes. With a polarizer, a display apparatus can block unnecessary external light. However, any transmitted external light causes a decrease in brightness of the display apparatus, thereby resulting in a reduction in lifetime of the display apparatus.

SUMMARY OF THE INVENTION

Accordingly, the present invention is directed to a display apparatus and a polarizer of a display apparatus that substantially obviate one or more of the problems due to limitations and disadvantages of the related art.

An object of the present invention is to provide a display apparatus capable of suppressing a decrease in brightness and improving a lifetime, and a polarizer thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display apparatus comprises a substrate; a light emitting element on the substrate, the light-emitting element being configured to emit visible light; and a polarizer including a polarizing object on the substrate, the polarizing object being configured to absorb ultraviolet light and visible light having wavelengths shorter than a blue light of the visible light emitted from the light emitting element and configured to transmit the visible light emitted from the light emitting element, and a supporting film on at least one surface of the polarizing object.

In another aspect, a polarizer comprises a polarizing object configured to absorb ultraviolet light and a visible light having wavelengths shorter than a blue light of a visible light emitted from a light emitting element and configured to transmit the visible light emitted from the light emitting element; and a supporting film located on at least one surface of the polarizing object.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
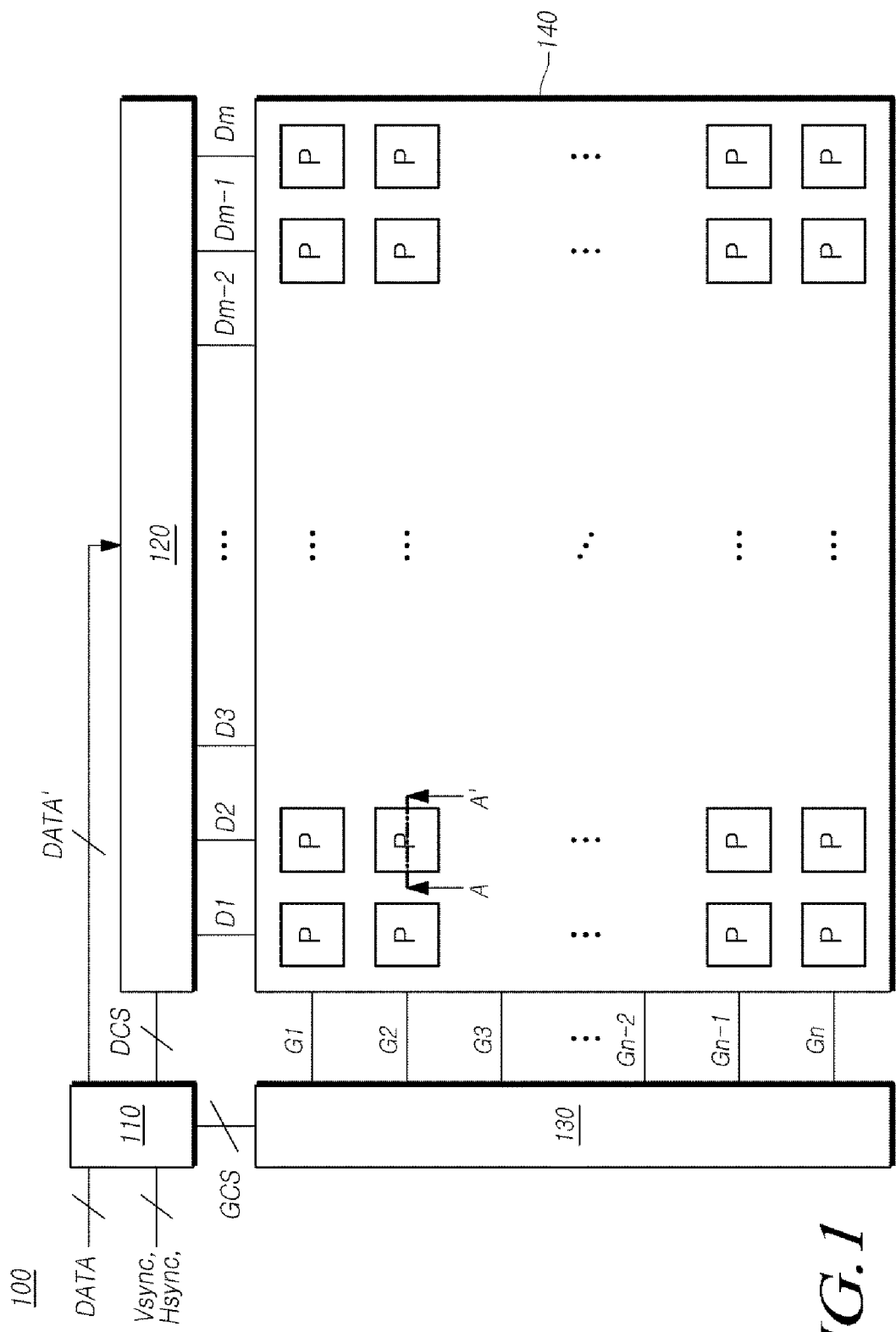
FIG. 1 is a system configuration view of a display apparatus according to an example embodiment of the present invention.

Reference will now be made in detail to embodiments of the present invention, examples of which are illustrated in the accompanying drawings. It should be noted that when reference numerals refer to components of each drawing, although the same components are illustrated in different drawings, the same components are referred to by the same reference numerals as possible. Further, if it is considered that description of related known configuration or function may cloud the gist of the present disclosure, the description thereof will be omitted.

Further, in describing components of the present disclosure, terms such as first, second, A, B, (a), (b), etc. can be used. These terms are used only to differentiate the components from other components. Therefore, the nature, order, sequence, etc. of the corresponding components are not limited by these terms. It is to be understood that when one element is referred to as being "connected to" or "coupled to" another element, it may be directly connected or coupled to another element or be connected or coupled to another element, having still another element "connected" or "coupled" therebetween. In the same context, it is to be understood that when one element is referred to as being "on" or "below" another element, it may be directly coupled "on" or "below" another element or be connected "on" or "below" another element or may be indirectly coupled "on" or "below" another element or be connected "on" or "below" another element, having still another element intervening therebetween.

In the present specification, the term "absorption of light" should be construed as including to not only optically 100% absorption but also optically meaningless transmission or transmission within an error range of a measuring device. Further, in the present specification, the term "transmission of light" should be construed as including optically 100% transmission but also optically meaningless non-transmission or non-transmission within an error range of a measuring device.

FIG. 1 is a system configuration view of a display apparatus according to an example embodiment of the present invention.

With reference to FIG. 1, a display apparatus 100 may include a timing controller 110, a data driver 120, a gate driver 130, a display panel 140, etc. The timing controller 110 outputs a data control signal DCS for controlling the data driver 120 and a gate control signal for controlling the gate driver 130 based on external timing signals, such as vertical/horizontal synchronization signals Vsync and Hsync, image data DATA, a clock signal CLK, etc. input from a host system. Further, the timing controller 110 may convert the image data DATA input from the host system in correspondence to a data signal form used by the data driver 120 and supply the converted image data DATA' to the data driver 120.

In response to the data control signal DCS and the converted image data DATA' input from the timing controller 110, the data driver 120 converts the image data DATA' into a data signal (analog pixel signal or data voltage) which is a voltage value corresponding to a gray scale and supplies the converted data signal to a data line. In response to the gate control signal GCS input from the timing controller 110, the gate driver 130 sequentially supplies scan signals (gate pulse or scan pulse, gate ON signal) to a gate line.

Meanwhile, pixels P on the display panel 140 may be formed in a pixel area defined by data lines D1 to Dm and gate lines G1 to Gn and may be disposed in a matrix form. The display panel 140 may be an organic light emitting display panel including a pixel electrode (anode) as a first electrode, a common electrode (cathode) as a second electrode, and an organic layer, but may be any one of various display panels such as a liquid crystal display panel. An organic emission layer included in each organic layer may include at least one of red, green, blue, and white organic emission layers or a white organic emission layer.

In the following example embodiments, for convenience in explanation, an organic light emitting display panel will be described as an example of the display panel 140, but the present invention is not limited thereto. The display panel 140 may be any one of various display panels such as a liquid crystal display panel.

Figure 2A:
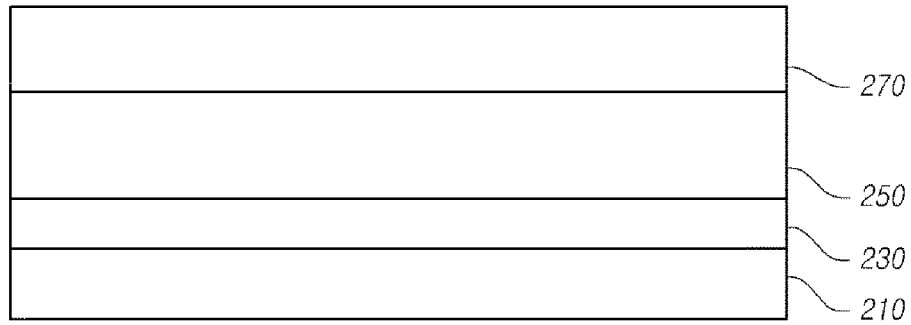
FIG. 2A and FIG. 2B are cross-sectional views taken along line A-A' of FIG. 1.
Figure 2B:
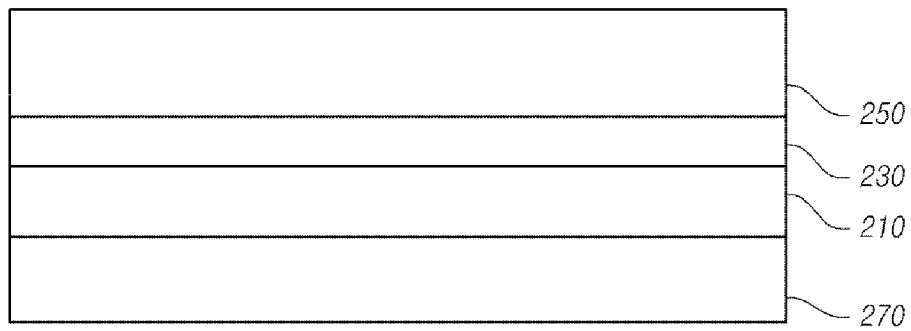

FIG. 2A and FIG. 2B are cross-sectional views taken along line A-A' of FIG. 1.

In FIG. 2A and FIG. 2B, a display apparatus 200 includes a driving element 230 disposed on one surface of a substrate 210, a light emitting element 250 disposed on the driving element 230, and a polarizer 270. In the following description, the display apparatus 200 may be a top-emission type in which a light is upwardly emitted, as illustrated in FIG. 2A, or may be a bottom-emission type, as illustrated in FIG. 2B. In the following description, the organic light emitting display apparatus 200 will be described as a top-emission display apparatus, as illustrated in FIG. 2A, but is not limited thereto, and may be a bottom-emission display apparatus as illustrated in FIG. 2B.

As shown in FIG. 2A, the substrate 210 may be formed into a glass substrate, a plastic substrate formed of a compound such as PET (polyethylene terephthalate), PEN (polyethylene naphthalate), polyimide, etc., or a transparent substrate formed of ITO (Indium Tin Oxide), IZO (Indium Zinc Oxide), etc., but is not limited thereto. The driving element 230 may include a thin film transistor (TFT) including a gate electrode, a gate insulation film, an active layer, an etch stopper, a source/drain electrode, etc. The thin film transistor included in the driving element 230 is illustrated as a bottom-gate type thin film transistor in which the gate electrode is located at the bottom, but is not limited thereto. The thin film transistor may be a top-gate type thin film transistor.

The light emitting element 250 may include a pixel electrode, an organic layer, a common electrode, etc. Although not illustrated, an organic emission layer EL may be included in the organic layer and a hole injection layer HIL, a hole transfer layer HTL, an electron transfer layer ETL, an electron injection layer EIL, etc. may be further included in the organic layer to readily form excitons.

Figure 2C:
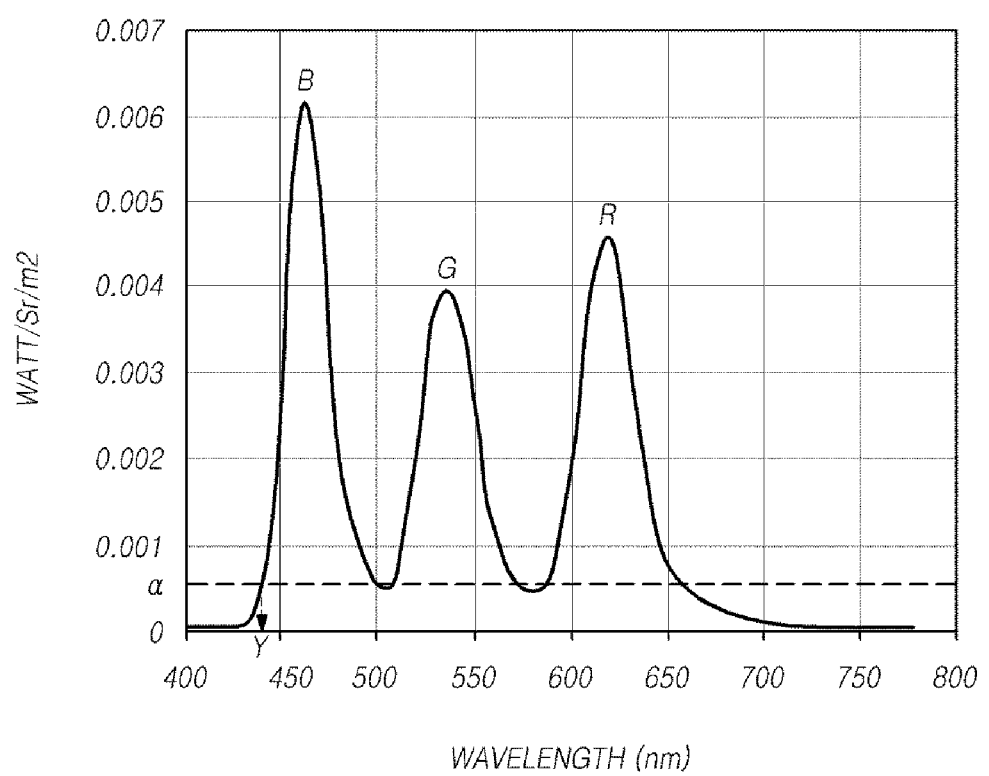
FIG. 2C is a graph illustrating brightness depending on a visible light emitted from a light emitting element as illustrated in FIG. 2A and FIG. 2B.

The light emitting element 250 may output a visible light including a blue light B, a green light G, and a red light R to the outside in various ways as illustrated in FIG. 2C, and the display apparatus 200 may display a natural color in a visible light range by combining the blue light B, the green light G, and the red light R. A passivation layer may be formed on the common electrode and functions to protect the organic layer from moisture and oxygen.

Then, the visible light output from the light emitting element 230 is in a non-polarized state, and, thus, the display apparatus 200 includes the polarizer 270 configured to convert the visible light output from the light emitting element 230 to a polarized state. The polarizer 270 also blocks an external light incident from the outside of the display apparatus 200. Herein, the visible light in a range of electromagnetic waves visible to the human eye. Although a visible light range is different for each person, a visible light range in the present specification will be described as being from 380 nm to 820 nm.

Figure 3A:
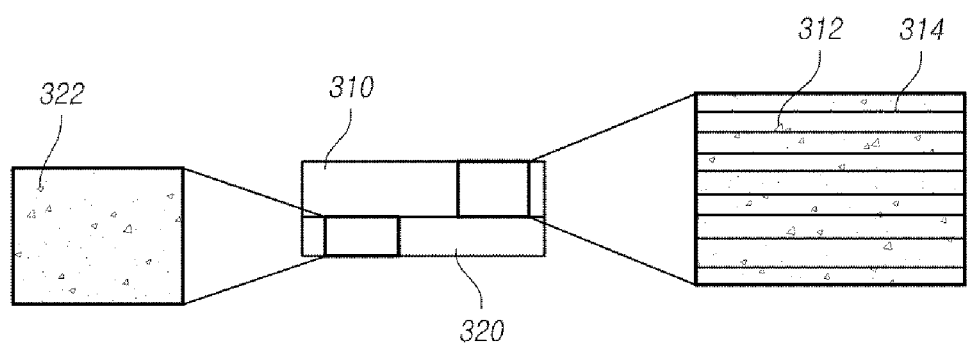
FIG. 3A through FIG. 3E are cross-sectional views of a polarizer according to other example embodiments of the present invention.
Figure 3B:
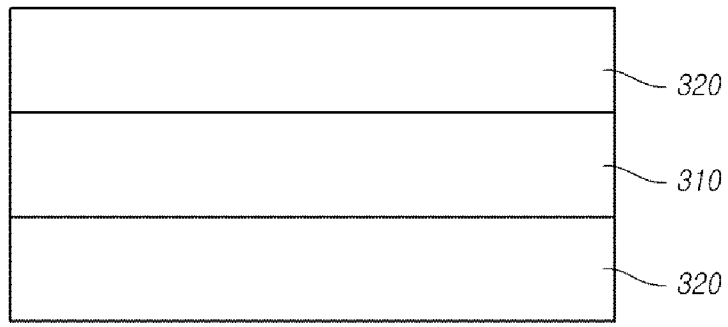

Hereinafter, polarizers according to various example embodiments will be described with reference to FIG. 3A and FIG. 3E. FIG. 3A through FIG. 3E are cross-sectional views of a polarizer according to other example embodiments of the present invention.

With reference to FIG. 3A and FIG. 3E, the polarizer 270 may include: a polarizing object 310 located on a light emitting element configured to emit a visible light and a substrate, and configured to absorb ultraviolet light and visible light having a shorter wavelength band than blue light of the visible light emitted from the light emitting element and transmit the visible light emitted from the light emitting element, and a supporting film 320 located on one surface or both surfaces of the polarizing object 310.

For example, the polarizing object 310 may absorb light having a wavelength band of from at least $X_1$ nm to $Y_1$ nm ($Y_1$ is the minimum wavelength corresponding to α% (α being a real number greater than 0 and equal to or smaller than 10) of a peak brightness of a blue light emitted from the light-emitting element 250). Further, the polarizing object 310 may transmit a visible light having a wavelength band greater than $Y_1$ nm.

Figure 6:
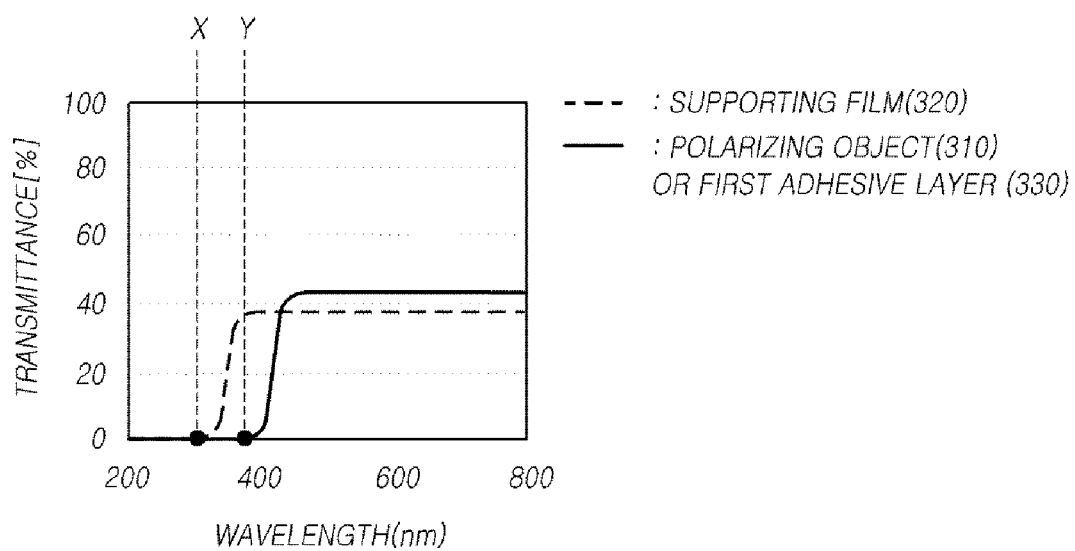
FIG. 6 is a graph illustrating light absorbency of the polarizing object, a first adhesive layer, and a supporting film as illustrated in FIG. 3A through FIG. 3E according to a wavelength.

Herein, $X_1$ may be the minimum wavelength of a light which the supporting film 320 cannot absorb, but transmits as illustrated in FIG. 6. Meanwhile, $Y_1$ may be the minimum wavelength corresponding to α% (α being a real number greater than 0) of a peak brightness of a blue light output as illustrated in FIG. 2C from the light emitting element 250 illustrated in FIG. 2A and FIG. 2B.

This is because a light absorbed by the polarizing object 270 absorbs a light output from the light emitting element 250 in order not to decrease a brightness of a blue light output through the display apparatus 200. Herein, α may have a range in which a blue light emitted from the light emitting element 250 penetrates the polarizer 200 and finally cannot be recognized or substantially cannot be recognized by the human eye. For example, α may be a real number greater than 0 and equal to or smaller than 10.

For another example, $Y_1$ may be a wavelength that is shorter by a specific wavelength band, e.g., 50 nm, than a peak wavelength of blue light output from the light emitting element 250. For yet another example, $Y_1$ may be a wavelength which is shorter by a specific wavelength band, e.g., 25 nm, than a wavelength corresponding to ½ of a peak brightness of blue light output from the light emitting element 250.

For example, the polarizing object 270 may absorb a light having a wavelength band of from at least 380 nm to 450 nm. For another example, the polarizing object 270 may absorb a light having a wavelength band of from at least 380 nm to 425 nm. For yet another example, the polarizing object 270 may absorb light having a wavelength band of from at least 380 nm to 400 nm.

The polarizer 270 may include a first dye that absorbs an ultraviolet light and a visible light having a shorter wavelength band than a blue light of the visible light emitted from the light emitting element 250 and transmits the visible light emitted from the light emitting element 250.

For example, the polarizer 270 may include a first dye 312 that absorbs a light having a wavelength band of from at least $X_1$ nm to $Y_1$ nm and transmits visible light having a wavelength band greater than $Y_1$ nm. In the following, the polarizer 270 will be described as including the first dye 312 that absorbs light having a wavelength band of from at least $X_1$ nm to $Y_1$ nm and transmits visible light having a wavelength band greater than $Y_1$ nm. However, the polarizer 270, itself, may absorb light having a wavelength band of from at least $X_1$ nm to $Y_1$ nm and transmit visible light having a wavelength band greater than $Y_1$ nm.

The first dye 312 may absorb light having a wavelength band of from at least 380 nm to 450 nm. For another example, the first dye 312 may absorb light having a wavelength band of from at least 380 nm to 425 nm. For yet another example, the first dye 312 may absorb light having a wavelength band of from at least 380 nm to 400 nm.

$X_1$ and $Y_1$ may vary depending on the kind of the polarizing object 310, the kind of the first dye 312, the kind of the supporting film 320, and a necessary condition for the polarizer 270. In the following, $X_1$ and $Y_1$ will be explained depending on specific conditions. However, the present invention is not limited thereto.

In the polarizer 270, the supporting film 320 may be located on one surface of the polarizing object 310, as illustrated in FIG. 3A. Otherwise, in the polarizer 270, two supporting films 320 may be located on both surfaces of the polarizing object 310 to support both sides of the polarizing object 310 in a sandwich manner as illustrated in FIG. 3B.

Figure 3C:
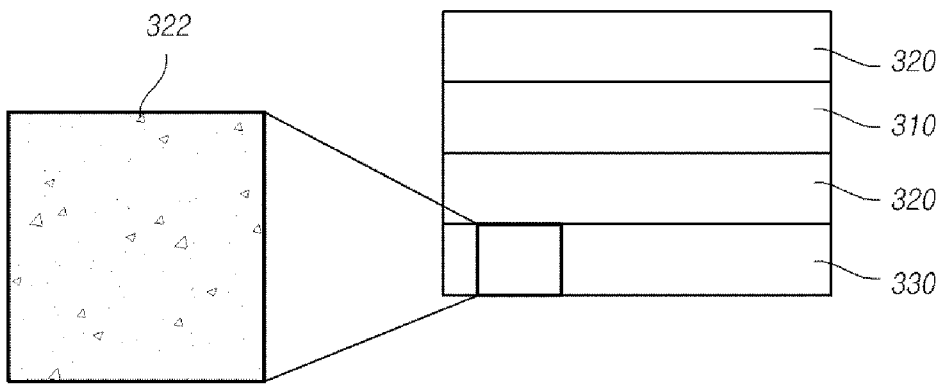

As shown in FIG. 3C, the polarizer 270 may include a first adhesive layer 330 disposed on one surface of the supporting film 320. Although FIG. 3C illustrates that the two supporting films 320 are located on both surfaces of the polarizing object 310 and the first adhesive layer 330 is disposed on one surface of the supporting film 320, only one supporting film 320 may be disposed on one surface of the polarizing object 310 and the first adhesive layer 330 may be located on one surface of the supporting film 320.

The first adhesive layer 330 may absorb ultraviolet light and visible light having a shorter wavelength band than blue light of the visible light emitted from the light emitting element 250 and transmit the visible light emitted from the light emitting element 250. For example, the first adhesive layer 330 may absorb light having wavelength band of from at least $X_2$ nm to $Y_2$ nm and transmit visible light having a wavelength band greater than $Y_2$ nm.

The first adhesive layer 330 may absorb light having a wavelength band of from at least 380 nm to 450 nm. For another example, the first adhesive layer 330 may absorb light having a wavelength band of from at least 380 nm to 425 nm. For yet another example, the first adhesive layer 330 may absorb a light having a wavelength band of from at least 380 nm to 400 nm.

The first adhesive layer 330 may include a second dye 332 that absorbs ultraviolet light and visible light having a shorter wavelength band than blue light of the visible light emitted from the light emitting element 250, and transmits the visible light emitted from the light emitting element 250. For example, the first adhesive layer 330 may include the second dye 332 that absorbs a light having a wavelength range of from at least $X_2$ nm to $Y_2$ nm, and transmits visible light having a wavelength band greater than $Y_2$ nm.

The second dye 332 may absorb light having a wavelength band of from at least 380 nm to 450 nm. For another example, the second dye 332 may absorb light having a wavelength band of from at least 380 nm to 425 nm. For yet another example, the second dye 332 may absorb light having a wavelength band of from at least 380 nm to 400 nm.

The first adhesive layer 330 has been described as including the second dye 332 that absorbs light having a wavelength range of from at least $X_2$ nm to $Y_2$ nm, and transmits a visible light having a wavelength band greater than $Y_2$ nm. However, the first adhesive layer 330, itself, may absorb light having a wavelength range of from at least $X_2$ nm to $Y_2$ nm, and transmit visible light having a wavelength band greater than $Y_2$ nm.

$X_2$ and $Y_2$ may vary depending on the kind of the polarizing object 310, the kind of the second dye 332, the kind of the supporting film 320, and a necessary condition for the polarizer 270. In the following, $X_2$ and $Y_2$ may be identical to $X_1$ and $Y_1$, respectively, but the present invention is not limited thereto. In the following, $X_2$ and $Y_2$ will be described as being identical to $X_1$ and $Y_1$, respectively, and will be denoted as "X" and "Y", respectively.

Figure 3D:
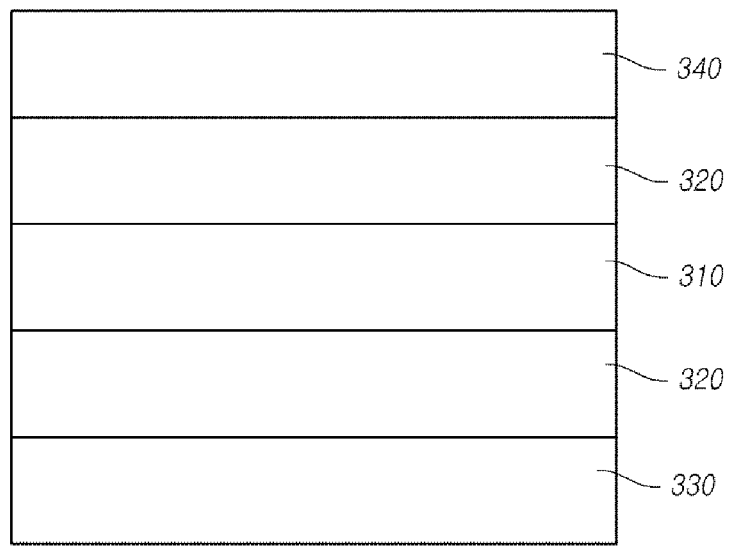
Figure 3E:
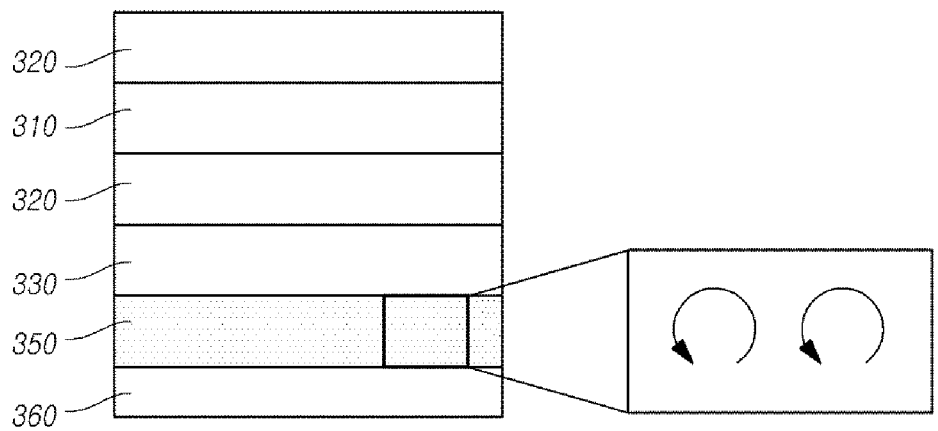

As illustrated in FIG. 3D, the polarizer 270 may include a functional film 340 on one supporting film 320, on which the first adhesive layer 330 is not located, among the two supporting films 320. The functional film 340 may be a protective film that protects the polarizer 270 from an external force, an anti-glare film that suppresses reflection of an external light, a surface-treated film for improving clarity and visibility of an image of the display apparatus, or a combination thereof.

Although FIG. 3D illustrates that the two supporting films 320 are located on both surfaces of the polarizing object 310 and the first adhesive layer 330 is disposed on one surface of one supporting film 320 and the function film 340 is disposed on one surface of the other supporting film 320, the first adhesive layer 330 may be disposed on one surface of the supporting film 320 and the functional film 340 may be disposed on the other surface of the polarizing object 310, as illustrated in FIG. 3A.

As illustrated in FIG. 3E, the polarizer 270 may further include a phase retardation layer 350 and a second adhesive layer 360 disposed in sequence on the first adhesive layer 330.

The phase retardation layer 350 may change a phase of light by, e.g., λ/4. For example, the phase retardation layer 350 may be formed into polyether sulfone (PES)- or cycloolefin polymer (COP)-based film. PES and COP have excellent reliability in a high temperature and high humidity condition and can be produced by a melting method. The phase retardation layer 350 may be formed by setting the orientation to retard a phase by ¼λ in a specific wavelength band through liquid crystal coating.

With reference to FIG. 3A through FIG. 3E, the polarizing object 310 may have a high transmittance in a wavelength range of red and blue visible lights, and may be stable in a poor environment such as with high temperature and high humidity. The polarizing object 310 may have a high light absorption force and a high dichroism in a broad wavelength band.

The polarizing object 310 may be a linear polarizing object that polarizes a light in one direction as illustrated in FIG. 3A. If the polarizing object 310 is a linear polarizing object, the polarizing object 310 may be formed of a polymer or a copolymer. Otherwise, the polarizing object 310 may have a high electric dipole moment in a molecule and may have a transmission axis (absorption axis or polarization axis) 314 elongated and parallel in a direction of a major axis.

For example, the polarizing object 310 may be formed by adsorbing haloid crystals, such as iodine on a polymer or copolymer film, and stretching the polymer or copolymer film in a specific direction the iodine crystals to be aligned in parallel with the stretched direction.

For example, the polarizing object 310 may be a polymer polymerized from a monomer represented by the following Chemical Formula 1.

[Chemical Formula 1]

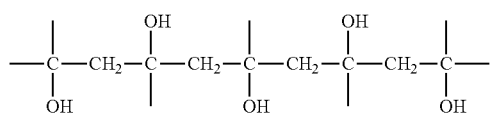

Figure 4A:
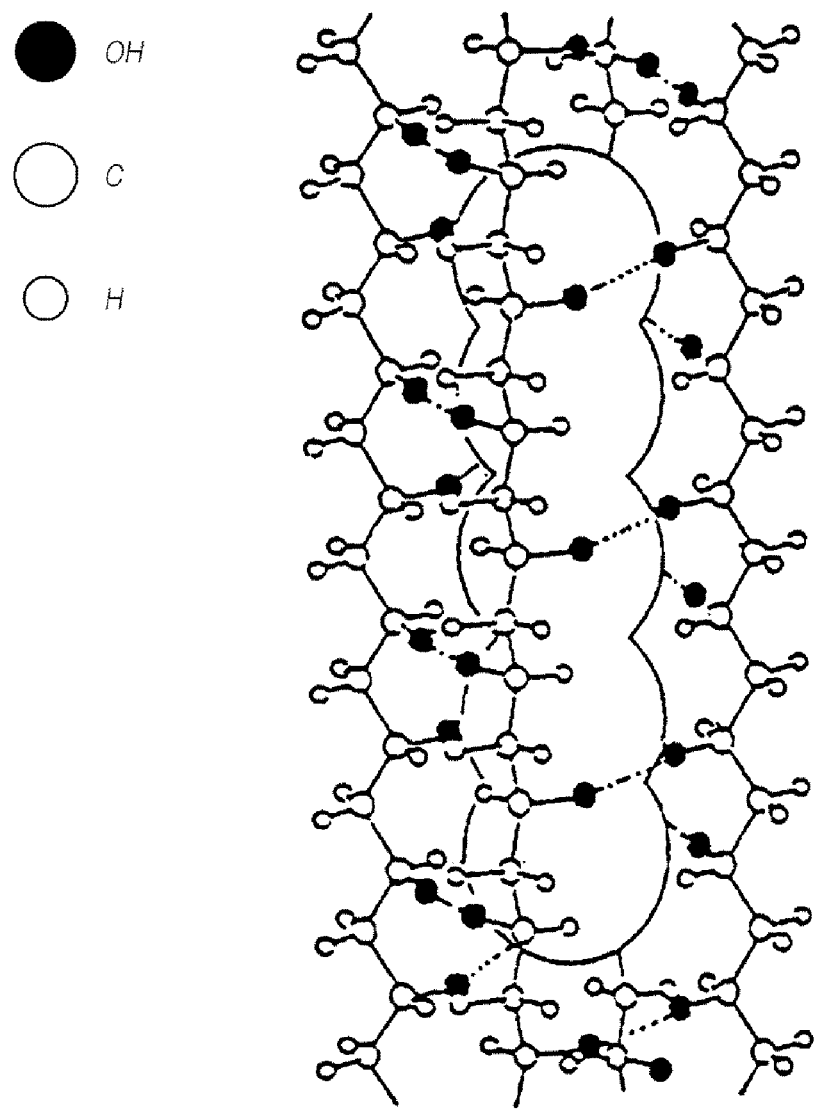
FIG. 4A is a three-dimensional (3D) stereographic image of a polymer used in a polarizing object as illustrated in FIG. 3A through FIG. 3E.
Figure 4B:
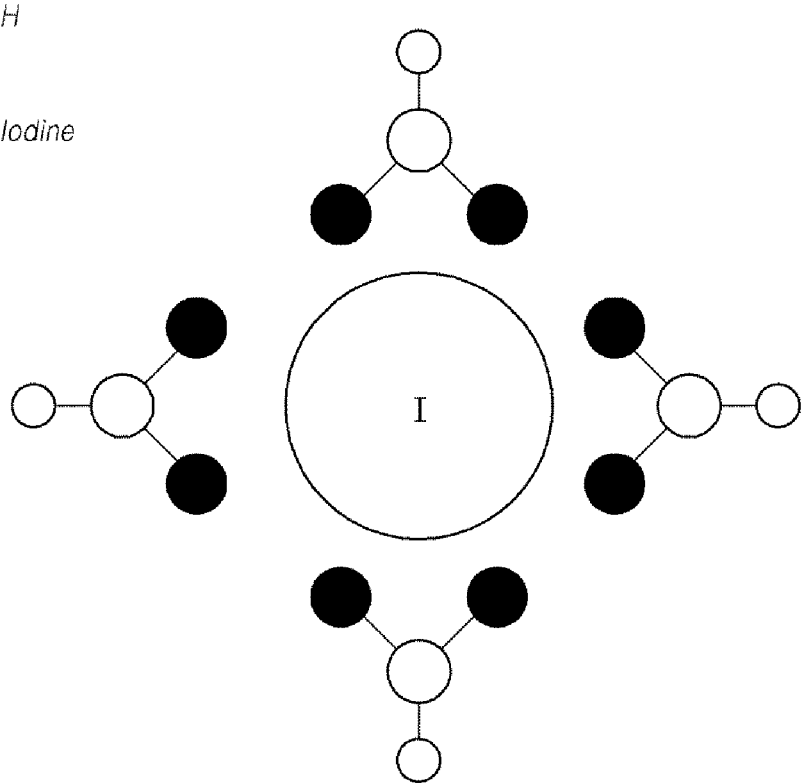
FIG. 4B and FIG. 4C are cross-sectional space layout drawings of the polymer used in the polarizing object as illustrated in FIG. 3A through FIG. 3E.
Figure 4C:
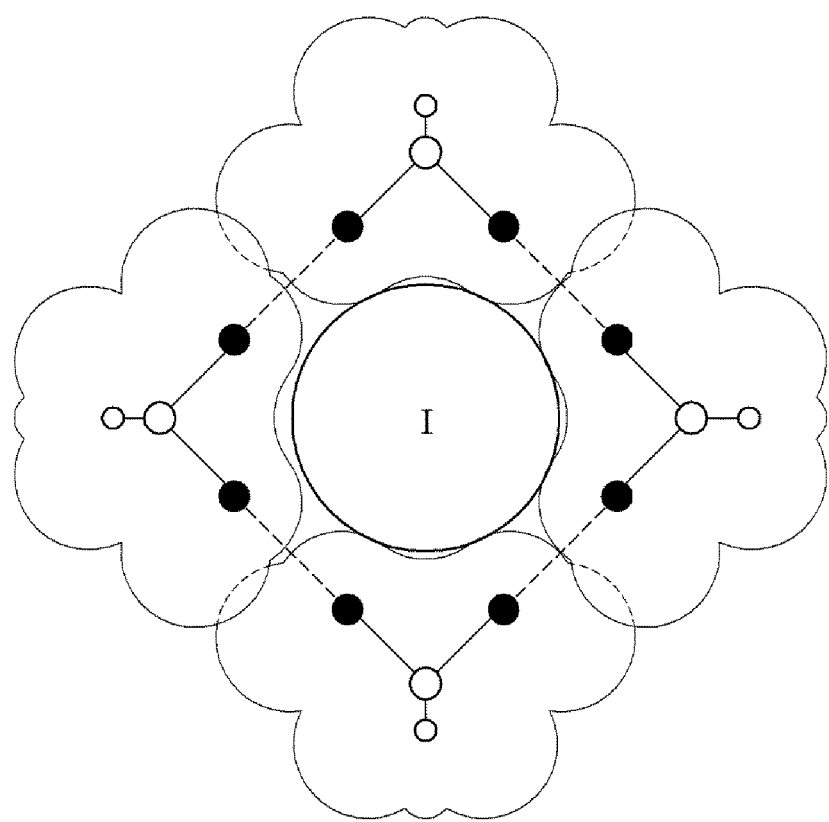

FIG. 4A is a three-dimensional (3D) stereographic image of a polymer used in a polarizing object as illustrated in FIG. 3A through FIG. 3E. FIG. 4B and FIG. 4C are cross-sectional space layout drawings of the polymer used in the polarizing object as illustrated in FIG. 3A through FIG. 3E.

In the polarizing object 310, the polymer polymerized from the monomer represented by Chemical Formula 1 may absorb a dichroic material, such as iodine. FIG. 4A through FIG. 4C illustrate a 3D stereographic structure in which OH groups constituting the polymer polymerized from the monomer represented by Chemical Formula 1 form a center circle around iodine and other elements (carbon (C) and hydrogen (H)) surround the OH groups. The polymer polymerized from the monomer represented by Chemical Formula 1 has a high electric dipole moment in a molecule and has an absorption axis elongated and parallel in a direction of a major axis. In the overall polarizing object 310, the polymer polymerized from the monomer represented by Chemical Formula 1 is aligned around iodine in a direction of a major axis and thus may have polarization in the aligned direction.

Figure 5:
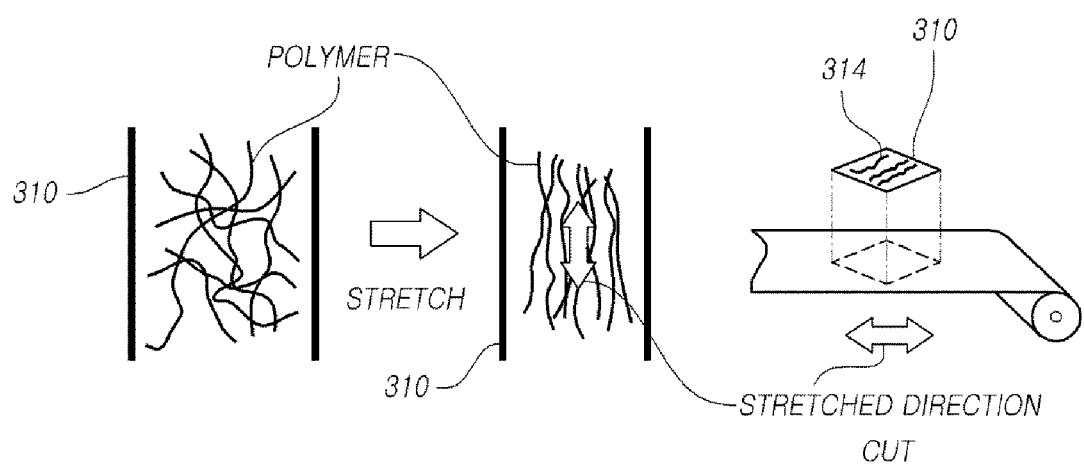
FIG. 5 is a manufacturing process diagram of the polarizing object as illustrated in FIG. 3A through FIG. 3E.

FIG. 5 is a manufacturing process diagram of the polarizing object as illustrated in FIG. 3A through FIG. 3E.

With reference to FIG. 5, if the polarizing object 310 is the polymer polymerized from the monomer represented by Chemical Formula 1, while molecules are aligned in the polymer without directionality in one direction, directionality is given to the molecules by stretching the polymer in a direction of a major axis in which the polymer has polarization. The polymer polymerized from the monomer represented by Chemical Formula 1 does not have a light-reactive property. Thus, to give polarization to the polymer, the polymer is dyed with a dichroic material, e.g., iodine or an aromatic dye, as described above. The supporting film 320 is bonded to one surface or both surfaces of the polarizing object 310, and then cut to be matched with the transmission axis (or absorption axis) 314. Therefore, the polarizer 270 including the polarizing object 310 that linearly polarizes a light in one direction can be manufactured.

FIG. 6 is a graph illustrating light absorbency of the polarizing object, a first adhesive layer, and a supporting film as illustrated in FIG. 3A through FIG. 3E according to wavelength.

As illustrated in FIG. 6, the first dye 312 included in the polarizing object 310 may be, for example, a dye including a light-absorbing group that absorbs a light having a wavelength band of from at least 400 nm to 425 nm (X=400, Y=425). For another example, the first dye 312 may also absorb light having a wavelength band of from at least 380 nm to 425 nm (X=380, Y=425). For yet another example, the first dye 312 may also absorb light of from at least 380 nm to 450 nm (X=380, Y=450). The first dye 312 may also absorb light having a wavelength of smaller than 380 nm. The first dye 312 may absorb light having a wavelength band of from 425 nm to 450 nm, depending on the kind of the first dye 312. As illustrated in FIG. 6, the first dye 312 may transmit light having a wavelength band out of the wavelength band in which the first dye 312 absorbs light. For example, if the first dye 312 absorbs light having a wavelength band of from 400 nm to 425 nm, the first dye 312 may transmit visible light having a wavelength band greater than 425 nm. If the first dye 312 absorbs light having a wavelength of from 425 nm to 450 nm, depending on the kind of the first dye 312, the first dye 312 may transmit visible light having a wavelength band greater than 450 nm.

The first dye 312 including a light-absorbing group may be, for example, a methine dye, but is not limited thereto. The methine dye may include one or more selected from the group consisting of a cyanine dye, a merocyanine dye, an arylidene dye, a sterile dye, and an oxonol dye represented by the following Chemical Formulas, respectively.

Cyanine dye: Bs=Lo-Bo [Chemical Formula 2]

Merocyanine dye: Bs=Le=Ak [Chemical Formula 3]

Arylidene dye: Ak=Lo-Ar [Chemical Formula 4]

Sterile dye: Bo-Le-Ar [Chemical Formula 5]

Oxonol dye: Ak=Lo-Ae [Chemical Formula 6]

In the above-described Chemical Formulas, Bs is a basic nucleus; Bo is an onium form of a basic nucleus; Ak is an acidic nucleus of a keto type; Ae is an acidic nucleus of an enol type; Ar is an aromatic nucleus; Lo is a methine chain having an odd number of methines; and Le is a methine chain having an even number of methines.

For another example, the methine dye may be an Eastman chemical yellow dye.

The first dye 312 may contain a compound that forms an aggregate just by dissolution or dispersion in water may be included. However, typically, an aggregate may be formed by adding gelatin or salt (e.g., potassium chloride, sodium chloride, barium chloride, calcium chloride, ammonium chloride) into an aqueous solution of the first dye 312.

For another example, the first dye 312 including a light-absorbing group may be one of acridin-9-yl-pheneyldiazene ($C_{19}H_4N_3$) represented by the following Chemical Formula 7, 2-(2-naphthylmethylene)-alpha-tetralone ($C_{21}H_{16}O$) represented by the following Chemical Formula 8, and N-mesityl-m-nitroisobenzaldoxim ($C_{16}H_{16}O_3N_2$ or light yellow), but is not limited thereto.

[Chemical Formula 7]

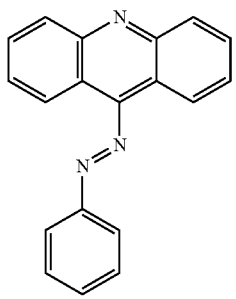

[Chemical Formula 8]

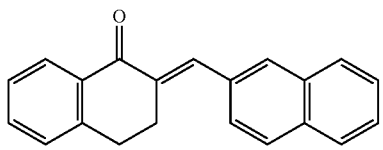

The supporting film 320 may be, for example, any one of a cycloolefin-based film, a polyester-based film, an acryl-based film formed of an acryl-based resin, a triacetyl cellulose film, and a cellulose-based film.

For example, if the supporting film 320 is the acryl-based film, the acryl-based resin may include PMMA (poly(methylmethacrylate)), PEA (phenylethylacrylate), PEMA (phenylethylmethacrylate), MPA (methylphenylacrylates), MPM (methylphenylmethacrylates), and HEMA (2-hydroxyethyl methacrylate).

For another example, if the supporting film 320 is the cellulose-based film, the supporting film 320 may be formed of triacetyl cellulose or cellulose triacetate, but is not limited thereto.

As illustrated in FIG. 6, the supporting film 320 may absorb light having a wavelength band smaller than $X_3$ nm. The supporting film 320, itself, may absorb light having a wavelength band smaller than $X_3$ nm, or the supporting film 320 may include a light absorbing agent 322 that absorbs light having a wavelength band smaller than $X_3$ nm. In the following, the supporting film 320 will be described as including the light absorbing agent 322 that absorbs light having a wavelength band smaller than $X_3$ nm. However, the supporting film 320, itself, may absorb light having a wavelength band smaller than $X_3$ nm. Herein, $X_3$ may be different from or identical to X ($X_1$ or $X_2$). In the following, $X_3$ is identical to X ($X_1$ or $X_2$) and thus denoted as "X", but is not limited thereto. For example, if X is 380, the light absorbing agent 322 may absorb a light having a wavelength band smaller than 380 nm. The light absorbing agent 322 may include one or more materials selected from the group consisting of a benzophenol-based ultraviolet light-absorbing agent, a benzotriazole-based ultraviolet light-absorbing agent, and a triazine-based ultraviolet light-absorbing agent.

The second dye 332 included in the first adhesive layer 330 may be identical to or different from the first dye 312. As illustrated in FIG. 6, the second dye 332 included in the first adhesive layer 330 may also be, for example, a dye including a light-absorbing group that absorbs a light having a wavelength band of from 400 nm to 425 nm (X=400, Y=425). For another example, the second dye 332 may also absorb light having a wavelength band of from 380 nm to 425 nm (X=380, Y=425). For yet another example, the second dye 332 may also absorb a light having a wavelength band of from 380 nm to 450 nm (X=380, Y=450). The second dye 332 may absorb light having a wavelength band smaller than 380 nm. The second dye 332 may absorb light having a wavelength band of from 425 nm to 450 nm, depending on the kind of the second dye 332. As illustrated in FIG. 6, the second dye 332 may transmit light having a wavelength band out of the wavelength band in which the second dye 332 absorbs light. For example, if the second dye 332 absorbs a light having a wavelength band of from 400 nm to 425 nm (X=400, Y=425), the second dye 332 may transmit visible light having a wavelength band greater than 425 nm. If the second dye 332 absorbs light having a wavelength of from 425 nm to 450 nm, depending on the kind of the second dye 332, the second dye 332 may transmit visible light having a wavelength band greater than 450 nm.

The second dye 332 including a light-absorbing group may be, for example, a methine dye, but is not limited thereto. The methine dye may include one or more selected from the group consisting of a cyanine dye, a merocyanine dye, an arylidene dye, a sterile dye, and an oxonol dye as described above.

For another example, the second dye 332 including a light-absorbing group may be one of acridin-9-yl-pheneyldiazene ($C_{19}H_4N_3$) represented by Chemical Formula 7, 2-(2-naphthylmethylene)-alpha-tetralone ($C_{21}H_{16}O$) represented by Chemical Formula 8, and N-mesityl-m-nitroisobenzaldoxim ($C_{16}H_{16}O_3N_2$ or light yellow), but is not limited thereto.

Figure 7:
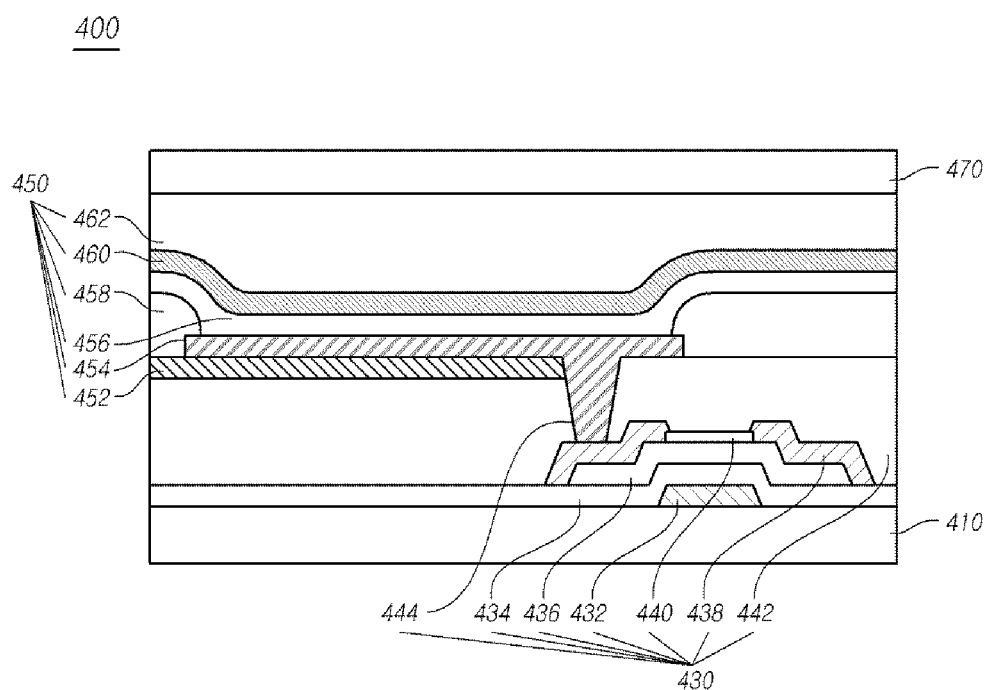
FIG. 7 is a cross-sectional view of a display apparatus according to yet another example embodiment of the present invention.

FIG. 7 is a cross-sectional view of a display apparatus according to yet another example embodiment of the present invention.

As shown in FIG. 7, a display apparatus 400 may have a specific structure of the top-emission display apparatus 200 illustrated in FIG. 2a. The display apparatus 400 may include a driving element 430 formed on a substrate 410, a light emitting element 450 formed on the driving element 430, and a polarizer 470 formed on the light emitting element 450.

The driving element 430 is formed on the substrate 410. The driving element 430 may include a gate electrode 432, a gate insulation film 434, an active layer 436, a source/drain electrode 438, an etch stopper 440, a flattening layer 442, a contact hole 444, etc. The light emitting element 450 may include a reflective layer 452, a pixel electrode 454, an organic layer 456, a bank 458, a common electrode 460, a passivation layer 462, etc. Meanwhile, the polarizer 470 may include a supporting film on one surface or both surfaces of the polarizing object 310 as illustrated in FIG. 3A and FIG. 3B. Further, the polarizer 470 may selectively include the first adhesive layer 330, the functional film 340, the phase retardation layer 350, and the second adhesive layer 360 as illustrated in FIG. 3C through FIG. 3E.

The gate electrode 432 may be formed into a single layer or multi-layer of a least one of metals, such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), or alloys thereof. The gate insulation film 434 may be formed of an inorganic insulation material such as $SiO_x$, $SiN_x$, SiON, etc. The active layer 436 may be formed of a semiconductor material or oxide, such as IGZO (Indium Gallium Zinc Oxide), ZTO (Zinc Tin Oxide), ZIO (Zinc Indium Oxide), etc. The source/drain electrode 327 located on the active layer 436 and electrically connected to the pixel electrode 454 through the contact hole 444 may be formed into a single layer or multi-layer of a least one of metals, such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) or alloys thereof.

After the flattening layer 442 including the contact hole 444 is formed, the light emitting element 450 is formed. The reflective layer 452 may be formed on the flattening layer 442. The reflective layer 452 may be formed of a metal, such as Al, Ag, Ni, Pt, etc., having an excellent reflectivity, or may be omitted depending on a material of the pixel electrode 454.

Then, the pixel electrode 454 may be formed to cover the reflective layer 452 and the flattening layer 442. The pixel electrode 454 may be an anode and may be formed of metals, such as aluminum (Al), silver (Ag), gold (Au), platinum (Pt), palladium (Pd), chromium (Cr), nickel (Ni), etc., having a high work function. If the pixel electrode 454 is used as a transparent electrode, it may be formed of a metal oxide, such as ITO (Indium Tin Oxide), IZO (Indium Zinc Oxide), etc.

If the pixel electrode 454 is formed of an opaque metal, the reflective layer 452 may be omitted. Thus, the pixel electrode 454 may serve as the reflective layer 452.

A bank 458 is formed at an edge of the pixel electrode 454, and the bank 458 includes an opening to expose the pixel electrode 454. The bank 458 may be formed of an inorganic insulation material, such as $SiO_x$, $SiN_x$, SiON, etc.

The organic layer 456 is formed in an area where the pixel electrode 454 is exposed. The organic layer 456 may include a hole injection layer, a hole transfer layer, an electron injection layer, an electron transfer layer, an organic emission layer, etc. A light is generated from the organic emission layer and upwardly emitted.

The common electrode 460 is formed on the organic emission layer 456 and the bank 458. The common electrode 460 may be a cathode and may be formed of LiF/Al, Mg—Ag, etc. having a low work function and a high transmittance.

Meanwhile, the passivation layer 462 is formed on the common electrode 460 and functions to protect the organic layer from moisture and oxygen. Further, the passivation layer 462 may be formed into a multi-layer structure including an inorganic material, an organic material, and a mixture thereof, and may further include a metal layer having a cap structure for encapsulation or a film-type metal foil layer.

The polarizer 470 is formed on the light emitting element 450. As described with reference to FIG. 5, if the polarizing object 310 is the polymer polymerized from the monomer represented by Chemical Formula 1, while molecules are aligned in the polymer without directionality in one direction, directionality is given to the molecules by stretching the polymer in a direction of a major axis in which the polymer has polarization. Then, the supporting film 320, or the like, is bonded to one surface or both surfaces of the polarizing object 310 and then cut to be matched with the transmission axis (or absorption axis). Therefore, the polarizer 470 including the polarizing object 310 that linearly polarizes a light in one direction can be manufactured. The manufactured polarizer 470 may be disposed on the light emitting element 450.

In the following, the polarizer 470 will be described as the polarizer 270 in which two supporting films 320 may be located on both surfaces of the polarizing object 310 as illustrated in FIG. 3E, and which includes the first adhesive layer 330, the phase retardation layer 350, and the second adhesive layer 360 in sequence on one supporting film 320. However, the polarizer 470 may be the polarizer 270 described with reference to FIG. 3A through FIG. 3D.

Optically, light generated from the light emitting element 450 is generated form the organic emission layer of the light emitting element 450 and retarded in phase by λ/4 while passing the phase retardation layer 350, and then output to the outside of the display apparatus 400. The polarizing object 310 aligns a direction of light passing through the phase retardation layer 350, and divides the light into two kinds of polarizing components orthogonal to each other. Further, the polarizing object 310 may transmit one of the two polarizing components and may absorb the other component. In this case, the polarizing object 310 transmits only light having an optical axis identical to a polarization axis of the polarizing object 310.

The structures of the display apparatuses 100, 200, and 400 according to example embodiments different from the example embodiment described above. Although the top-emission display apparatus 400 has been described according to the example embodiments of the present invention, a bottom-emission display apparatus can also be applied.

Figure 8:
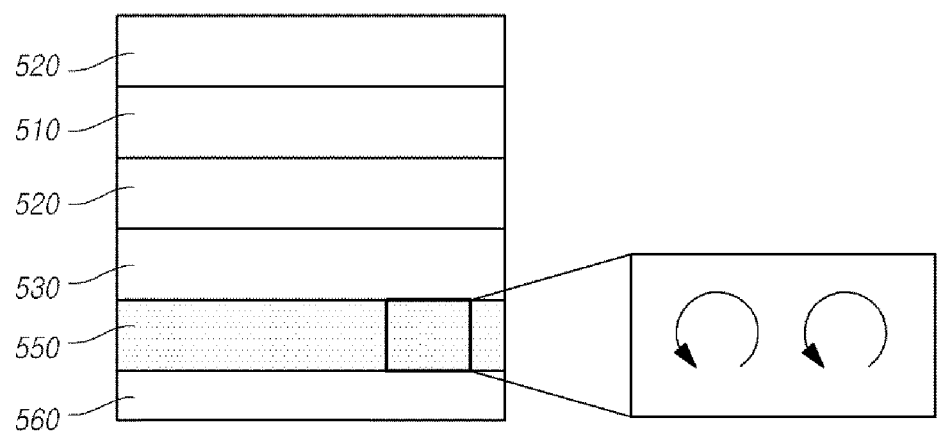
FIG. 8 is a detailed cross-sectional view of a polarizer of a display apparatus according to a comparative example.

FIG. 8 is a detailed cross-sectional view of a polarizer of a display apparatus according to a comparative example.

The display apparatus according to the comparative example is the same as the display apparatus 400 described with reference to FIG. 7, and a polarizer 570 may include two supporting films 520 respectively disposed on both surfaces of a polarizing object 510 as illustrated in FIG. 8 and further include a first adhesive layer 530, a phase retardation layer 550, and a second adhesive layer 560 on one of the supporting films 520 in sequence. The supporting film 520, the phase retardation layer 550, and the second adhesive layer 560 are the same as the supporting film 520, the phase retardation layer 550, and the second adhesive layer 560 described with reference to FIG. 3E. However, unlike the polarizing object 310 and the first adhesive layer 330 of the polarizer 270 according to the example embodiments, the polarizing object 520 and the first adhesive layer 530 do not include the first dye 312 and the second dye 332 that absorb a light having a wavelength band of from at least 400 nm to 425 nm.

Figure 9A:
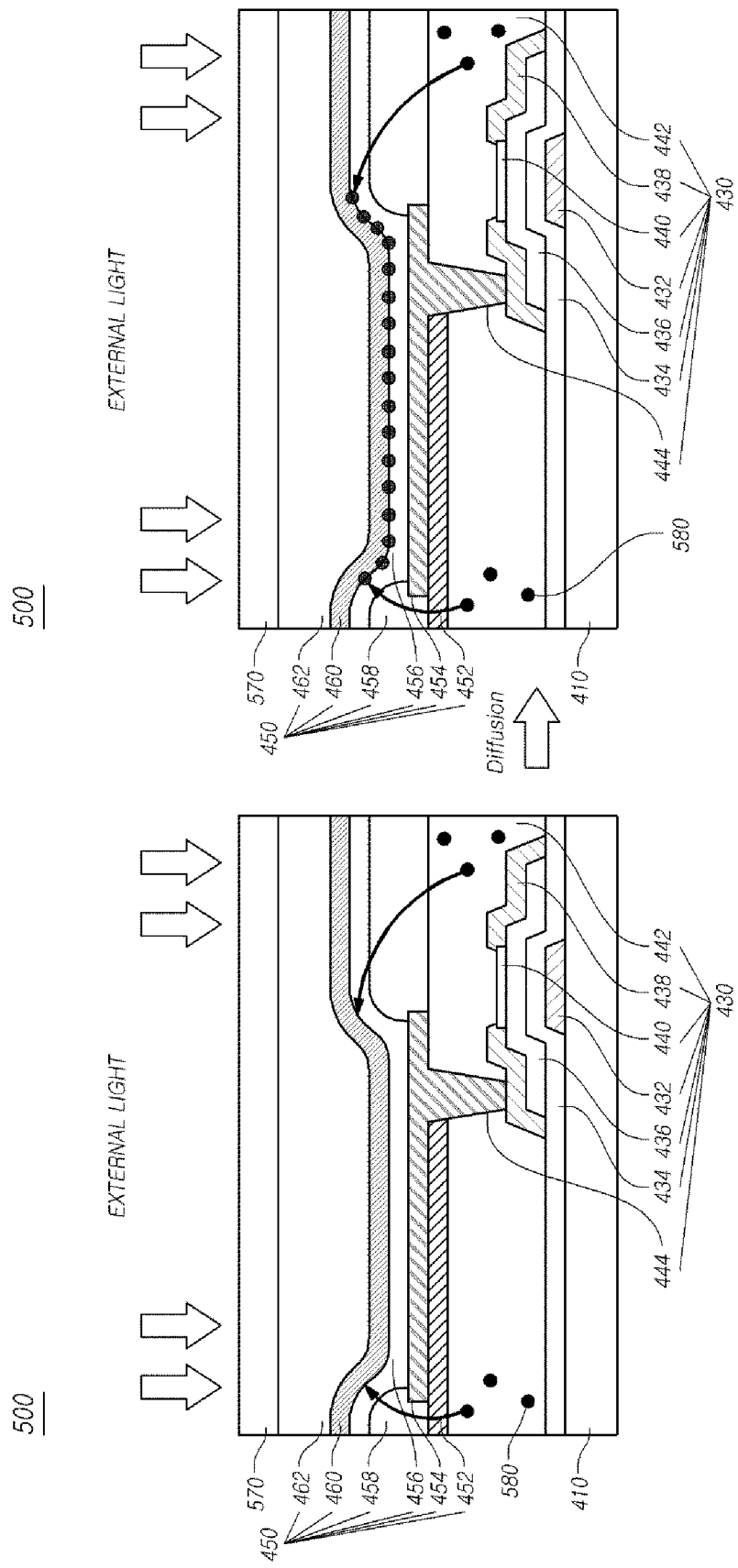
FIG. 9A illustrates a reaction process caused by an external light in the polarizer of the display apparatus according to the comparative example illustrated in FIG. 8.
Figure 10A:
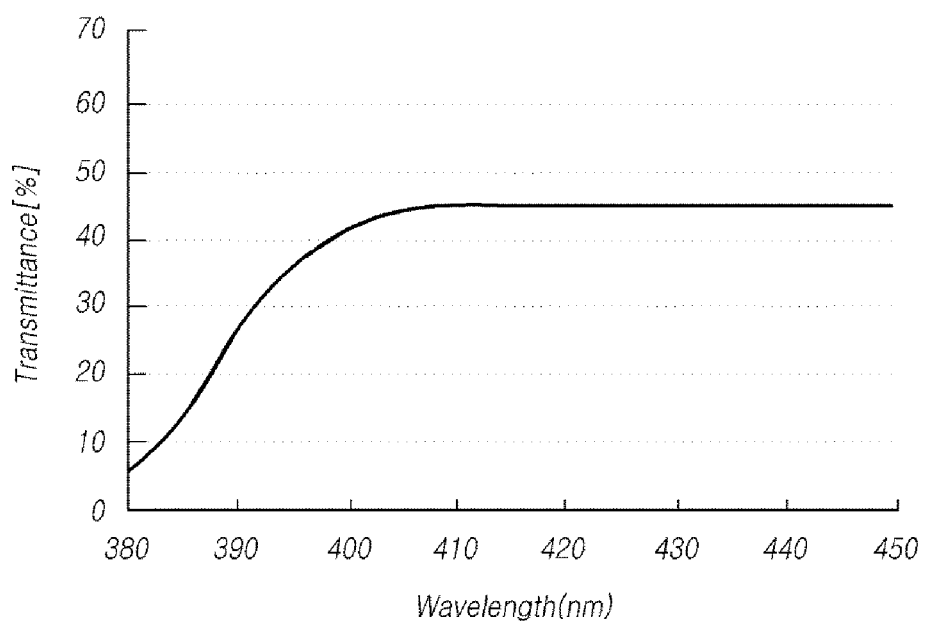
FIG. 10A illustrates a light absorbency of the polarizer of the display apparatus according to the comparative example illustrated in FIG. 8 according to wavelength.

FIG. 9A illustrates a reaction process caused by an external light in the polarizer of the display apparatus according to the comparative example illustrated in FIG. 8. FIG. 10A illustrates a light absorbency of the polarizer of the display apparatus according to the comparative example illustrated in FIG. 8 according to wavelength.

As illustrated in FIG. 9A, in the polarizer 570 of the display apparatus according to the comparative example, the polarizing object 310 and the first adhesive layer 330 do not include the first dye 312 and the second dye 332 that absorb light having a wavelength band of from at least 400 nm to 425 nm (X=400, Y=425) and transmit visible light having a wavelength band greater than 425 nm. Thus, it is possible to block only light with a short wavelength smaller than 400 nm.

Therefore, if the polarizer 570 is exposed to an external light having all wavelength bands, the polarizer 570 transmits an external light having a wavelength band of from 400 nm to 425 nm into the display apparatus as illustrated in FIG. 10A. The transmitted external light having a wavelength band of from 400 nm to 425 nm causes a layer, e.g., the flattening layer 342, formed of an organic material and/or an inorganic material and a combination thereof within the display apparatus to generate an outgassing 580. Then, particles of the generated outgassing 580 diffuse between the pixel electrode 454 and the organic layer 456 and function as electrical resistances between the pixel electrode 454 and the organic layer 456 as illustrated in FIG. 9A, and, thus, decrease a brightness when the display apparatus is powered on. Therefore, the comparative example may reduce a lifetime of the display apparatus.

Figure 9B:
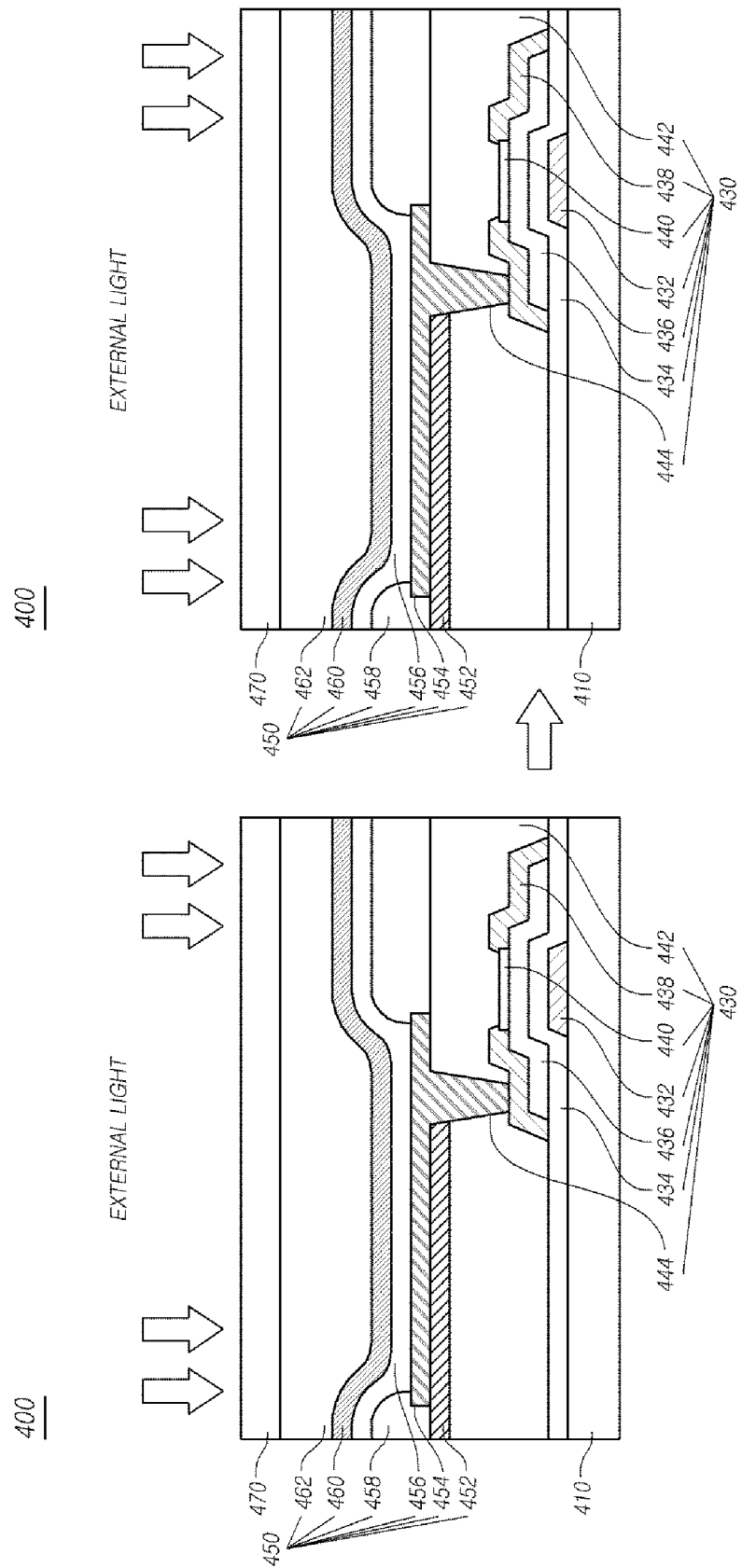
FIG. 9B illustrates a reaction process caused by an external light in a polarizer of the display apparatus according to the example embodiment illustrated in FIG. 7.
Figure 10B:
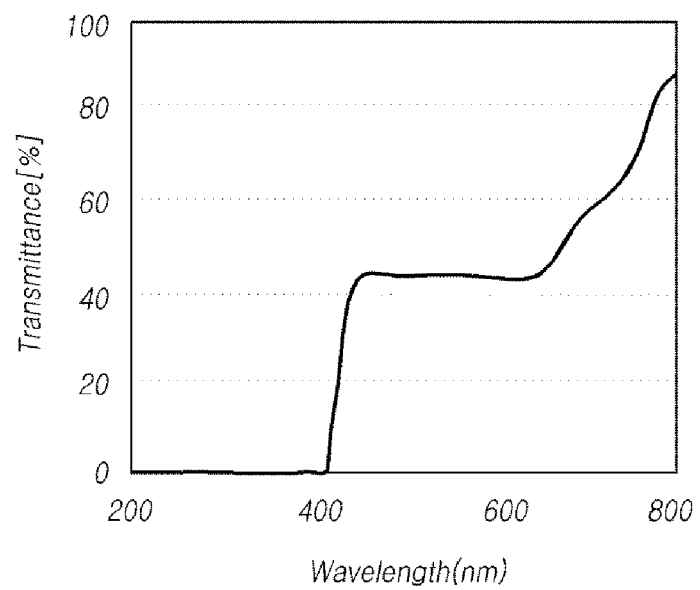
FIG. 10B illustrates a light absorbency of the polarizer of the display apparatus according to the example embodiment illustrated in FIG. 7 according to wavelength.

FIG. 9B illustrates a reaction process caused by an external light in a polarizer of the display apparatus according to the example embodiment illustrated in FIG. 7. FIG. 10B illustrates a light absorbency of the polarizer of the display apparatus according to the example embodiment illustrated in FIG. 7 according to wavelength.

As illustrated in FIG. 9B, in the polarizer 470 of the display apparatus 400 according to the example embodiment illustrated in FIG. 7, the polarizing object 310 and the first adhesive layer 330 include the first dye 312 and the second dye 332 that absorb light having a wavelength band of from 400 nm to 425 nm. Thus, it is possible to block light with a short wavelength smaller than 400 nm.

Therefore, if the polarizer 470 is exposed to an external light having all wavelength bands, the polarizer 470 does not transmit an external light having a wavelength band of from 400 nm to 425 nm into the display apparatus 400 as illustrated in FIG. 10B. The transmitted external light having a wavelength band of from 400 nm to 425 nm does not cause a layer, e.g., the flattening layer 342, formed of an organic material and/or an inorganic material and a combination thereof within the display apparatus 400 to generate an outgassing 580 to generate an outgassing.

That is, the polarizer 470 includes a dye that absorbs a light having a wavelength band of from 400 nm to 425 nm and, thus, blocks an external light having a wavelength band of 400 nm to 425 nm. Therefore, it is possible to suppress generation of an outgassing by a layer, e.g., the flattening layer 342, formed of an organic material and/or an inorganic material and a combination thereof within the display apparatus 400 and thus possible to suppress generation of electrical resistance between the pixel electrode 454 and the organic layer 456 by ions included in the outgassing. Therefore, it is possible to suppress a decrease in brightness when the display apparatus 400 is powered on, and thus it is possible to improve a lifetime of the display apparatus 400.

The display apparatus 400, including the polarizer 470 that absorbs a light having a wavelength band of from 400 nm to 425 nm according to yet another example embodiment, has been described by comparison with the display apparatus including the polarizer 570 that cannot block a light having a wavelength band of from 400 nm to 425 nm according to the comparative example with reference to FIG. 7 through FIG. 10B. Herein, even if the display apparatus 400 according to yet another example embodiment uses the polarizer 270 illustrated in FIG. 3A through FIG. 3E as the polarizer 470 of the display apparatus 400 as described above, the polarizer 470 can block an external light having a wavelength band of from 400 nm to 425. Thus, it is possible to obtain the same effect.

According to the above-described example embodiments, there is an effect of being able to suppress a decrease in brightness of a display apparatus and improve a lifetime of the display apparatus.

The example embodiments have been described with reference to the accompanying drawings, but the present invention is not limited thereto.

Although the first dye 312 and the second dye 332 have been described as being included in the polarizing object 310 and the first adhesive layer 330, respectively, in the above-described example embodiments, a dye that absorbs light having a wavelength band of X nm to Y nm and transmits visible light having a wavelength band greater than Y nm may also be included in at least one of other components, e.g., the supporting film 320, the functional film 340, and the second adhesive layer 360. Otherwise, the dye that absorbs light having a wavelength band of X nm to Y nm and transmits visible light having a wavelength band greater than Y nm may not be included in the polarizing object 310 and the first adhesive layer 330 but may be included in at least one of other components, e.g., the supporting film 320, the functional film 340, and the second adhesive layer 360.

Further, the polarizing object 310 included in the polarizer 270 has been described as including the first dye in the above-described example embodiments. However, in a structure without the polarizing object 310, e.g., an optical film including a functional film and an adhesive film, the functional film or the adhesive layer may include the dye that absorbs light having a wavelength band of from X nm to Y nm and transmits a visible light having a wavelength greater than Y nm. In the above-described example embodiments, specific values of X and Y have been provided. However, the present invention is not limited thereto, and various modifications can be made.

Further, in the above-described example embodiments, example kinds of the first dye, the second dye, and the light-absorbing agent have been listed. However, the present invention is not limited thereto.

Embodiments of the present invention have an effect of suppressing a decrease in brightness of a display apparatus and improving a lifetime of the display apparatus.

The term "comprises", "includes" or "has" and/or "comprising", "including" or "having" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added. All terms including technical and scientific terms used in the present disclosure are in effect equivalent to terms generally understood by those skilled in the art unless they are defined otherwise. Terms defined in a generally used dictionary shall be construed as having meanings equivalent to contextual meanings used in the art, but shall not be construed as having ideal or excessively forming meanings unless they are clearly defined in the present disclosure.

It will be apparent to those skilled in the art that various modifications and variations can be made in the display apparatus and the polarizer of embodiments of the present invention without departing from the spirit or scope of the invention. Thus, it is intended that embodiments of the present invention cover the modifications and variations of this invention provided they come within the scope of the appended claims and their equivalents.

What is claimed is:

1. A display apparatus, comprising:
a substrate;
a light emitting element on the substrate, the light-emitting element being configured to emit visible light; and
a polarizer comprising:
a polarizing object on the substrate, the polarizing object being configured to absorb ultraviolet light and visible light having wavelengths of 380 nm to 420 nm of the visible light emitted from the light emitting element and configured to transmit the visible light emitted from the light emitting element, where a supporting film is present on at least one surface of the polarizing object, a first adhesive layer is present on one surface of the supporting film, a phase retardation layer is present on one surface of the first adhesive layer, and a second adhesive layer is present on one surface of the phase retardation layer;
wherein the supporting film is directly contacted with the polarizing object,
wherein the supporting film includes any one of a polyester-based film and an acryl-based film formed of an acryl-based resin,
wherein the first adhesive layer absorbs ultraviolet light and visible light having wavelengths of 380 nm to 425 nm emitted from the light emitting element, and transmits the visible light emitted from the light emitting element,
wherein the polarizing object has a 3D stereographic structure in which OH groups present in a polymer polymerized from the monomer represented by Chemical Formula 1

[Chemical Formula 1]

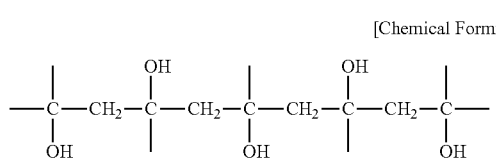

form a center circle around an iodine atom, and carbon (C) atoms attached to the OH groups are positioned outward from the iodine atom, and
wherein the polarizing object includes a first dye that absorbs ultraviolet light and visible light having wavelengths shorter than the blue light of the visible light emitted from the light emitting element and that transmits the visible light emitted from the light emitting element.

2. The display apparatus according to claim 1, wherein the polarizing object absorbs light having a wavelength of at least 380 nm to 400 nm.

3. The display apparatus according to claim 1, wherein the first adhesive layer includes a second dye that absorbs ultraviolet light and visible light having wavelengths shorter than the blue light of the visible light emitted from the light emitting element and that transmits the visible light emitted from the light emitting element.

4. The display apparatus according to claim 1, wherein the supporting film absorbs ultraviolet light having wavelengths smaller than 380 nm.

5. The display apparatus according to claim 1, wherein the first dye includes one of acridin-9-yl-phenyldiazene, 2-(2-naphthylmethylene)-alpha-tetraloneand N-mesityl-m-nitroisobenzaldoxim.

6. The display apparatus according to claim 1,
wherein the light emitting element includes a pixel electrode, an organic layer, a bank and a common electrode, and
wherein the bank is formed of an inorganic insulation material.

7. The display apparatus according to claim 6,
wherein the inorganic insulation material is selected from at least one of SiOx, SiNx and SiON.

8. A polarizer, comprising:
a polarizing object configured to absorb ultraviolet light and a visible light having wavelengths of 380 nm to 450 nm of a visible light emitted from a light emitting element and configured to transmit the visible light emitted from the light emitting element;
a supporting film located on at least one surface of the polarizing object;
a first adhesive layer present on one surface of the supporting film;
a phase retardation layer present on one surface of the first adhesive layer, and
a second adhesive layer present on one surface of the phase retardation layer,
wherein the supporting film is directly contacted with the polarizing object,
wherein the supporting film includes any one of a polyester-based film and an acryl-based film formed of an acryl-based resin,
wherein the first adhesive layer absorbs ultraviolet light and visible light having wavelengths of 380 nm to 425 nm emitted from the light emitting element, and transmits the visible light emitted from the light emitting element,
wherein the polarizing object has a 3D stereographic structure in which OH groups present in a polymer polymerized from the monomer represented by Chemical Formula 1

[Chemical Formula 1]

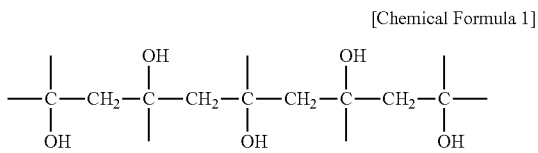 [SMILES: CC(C)(O)CC(C)(O)CC(C)(O)CC(C)(O)CC(C)(C)O]

form a center circle around an iodine atom and carbon (C) atoms attached to the OH groups are positioned outward from the iodine atom, and wherein the polarizing object includes a first dye that absorbs ultraviolet light and visible light having wavelengths shorter than the blue light of the visible light emitted from the light emitting element and that transmits the visible light emitted from the light emitting element.

9. The polarizer according to claim 8, wherein the polarizing object absorbs light having a wavelength of at least 380 nm to 400 nm.

10. The polarizer according to claim 8, wherein the first adhesive layer includes a second dye that absorbs ultraviolet light and visible light having wavelengths shorter than the blue light of the visible light emitted from the light emitting element and that transmits the visible light emitted from the light emitting element.

11. The polarizer according to claim 8, wherein the supporting film absorbs ultraviolet light having a wavelength smaller than 380 nm.

12. The polarizer according to claim 8, wherein the first dye includes one of acridin-9-yl-phenyldiazene, 2-(2-naphthylmethylene)-alpha-tetralone, and N-mesityl-m-nitroisobenzaldoxim.

13. The polarizer according to claim 8, wherein the light emitting element includes a pixel electrode, an organic layer, a bank and a common electrode, and wherein the bank is formed of an inorganic insulation material.

14. The polarizer according to claim 13, wherein the inorganic insulation material is selected from at least one of SiOx, SiNx and SiON.

* * * * *